(12) United States Patent
Singh et al.

(10) Patent No.: US 7,898,324 B1
(45) Date of Patent: Mar. 1, 2011

(54) METHOD AND SYSTEM FOR GLITCH SUPPRESSION IN DUAL-AMPLIFIER CIRCUIT

(75) Inventors: Raminder Jit Singh, San Jose, CA (US); Ansuya P. Bhatt, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 12 days.

(21) Appl. No.: 12/383,142

(22) Filed: Mar. 20, 2009

(51) Int. Cl.
*H03F 1/14* (2006.01)

(52) U.S. Cl. ..................................... 330/51; 330/124 R

(58) Field of Classification Search .................. 330/51, 330/207 A, 124 R
See application file for complete search history.

(56) References Cited

U.S. PATENT DOCUMENTS 5,161,198 A * 11/1992 Noble ......................... 381/81

* cited by examiner

*Primary Examiner*—Robert Pascal
*Assistant Examiner*—Khiem D Nguyen

(57) ABSTRACT

An apparatus includes first and second amplifiers, each having an input coupled to an audio signal input and an output coupled to an audio signal output. The second amplifier also has a feedback path from its output to its input. A first switch can be operated to selectively couple and uncouple the audio signal input and the input to the first amplifier to and from a first node. A second switch can be operated to selectively couple and uncouple the input of the second amplifier to and from a second node. A third switch can be operated to selectively couple and uncouple the first node to and from ground.

20 Claims, 4 Drawing Sheets

METHOD AND SYSTEM FOR GLITCH SUPPRESSION IN DUAL-AMPLIFIER CIRCUIT

TECHNICAL FIELD

This disclosure is generally directed to amplifier circuits. More specifically, this disclosure is directed to a method and system for glitch suppression in dual-amplifier circuit.

BACKGROUND

There is continual market pressure to design portable devices to be smaller, smarter and more complex. In some portable devices, an audio device with multiple input signal sources that drives a speaker for both earpiece and hands free operation may be integrated into a single, mixed-signal subsystem. Such integration provides a better form factor and fewer external components.

Power consumption is one major issue faced by manufacturers of portable devices. This is one reason that manufacturers are using highly efficient class D power amplifiers in more and more handheld and other portable devices. However, a class D power amplifier may have a higher noise level than a class AB power amplifier, which can make the class D amplifier less suitable for earpiece or headphone applications.

One way to reduce printed circuit board space and component costs is to use the same speaker for both hands free and earpiece operation. One way to achieve this is to couple the single speaker to both the output of a class AB power amplifier (for earpiece operation) and the output of a class D power amplifier (for hands free operation).

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
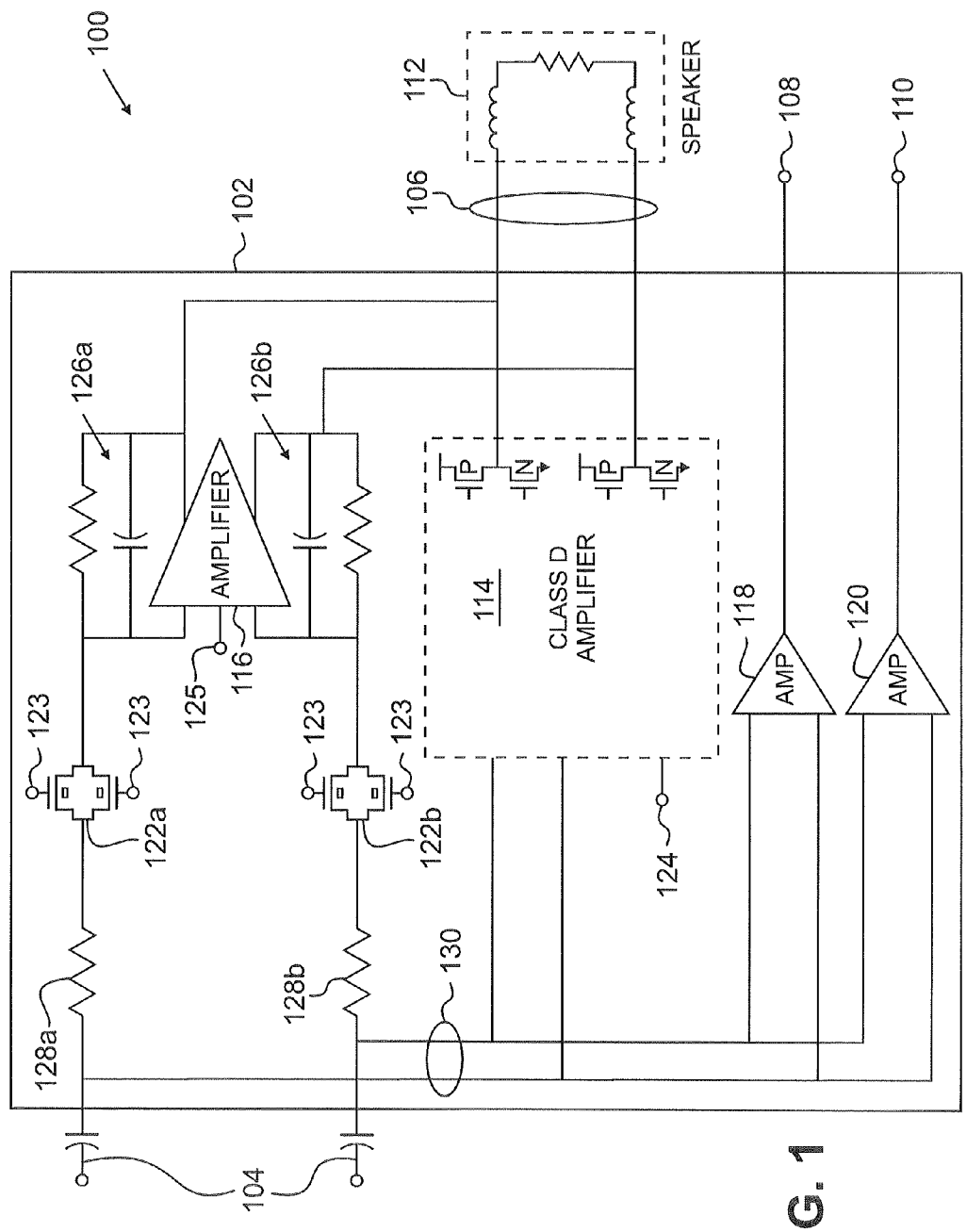
FIG. 1 illustrates a system that includes a speaker and an amplifier circuit.

FIG. 1 illustrates a system 100 that includes a speaker 112 and an amplifier circuit 102. The amplifier circuit 102 includes an audio signal input 104 and an audio signal output 106, which is coupled to the speaker 112. The amplifier circuit 102 further includes an audio signal output 108 and an audio signal output 110.

The amplifier circuit 102 includes an amplifier 114, which may be a class D amplifier, and a second amplifier 116, which may be a class AB amplifier. The amplifier circuit 102 further includes amplifier 118 and amplifier 120. Conductors 130 couple the audio signal input 104 in parallel to inputs of the amplifiers 114, 116, 118, and 120. In this example, the audio signal input 104 is a balanced input, although it will be understood that a single-ended audio signal input could also be used.

The amplifiers 114 and 116 provide balanced outputs and are coupled in parallel to the audio signal output 106 and, hence, to the speaker 112. Each of the amplifiers 118 and 120 provides a single-ended output, and the amplifiers 118 and 120 are respectively coupled to the audio signal output 108 and the audio signal output 110. It will be understood that any combination of balanced and single-ended audio signal outputs could be used.

Feedback circuits 126a and 126b coupled each side of the balanced audio signal output 106 to the balanced input of the amplifier 116. As shown in FIG. 1, the feedback circuits 126a and 126b are R-C circuits, however it will be understood that other feedback circuits could be used. A switch 122a and a resistor 128a couple one side of the balanced input of the amplifier 116 to one side of the balanced audio signal input 104. Similarly, a switch 122b and a resistor 128b couple the other side of the balanced input of the amplifier 116 to the other side of the balanced audio signal input 104. In the amplifier circuit 102, the switches 122a and 122b are implemented using back-to-back p-channel and n-channel devices, although other switches could be used.

In some applications, the system 100 is used in a handheld device where a user, at certain times, holds the speaker 112 to her ear for use as an earpiece and, at other times, holds the speaker away from her ear, for hands-free or walkie-talkie operation. In the first instance, the amplifier 116 may be used to power the speaker 112, to reduce power consumption by the system 100 and noise. In the second instance, the amplifier 114 may be used to produce higher sound volumes from the speaker 112.

In the first instance, a control input 124 to the amplifier 114 may be used to inactivate the amplifier 114, a control input 125 may be used to activate the amplifier 116, and control inputs 123 may be used to configure the switches 122a and 122b to couple the audio signal input 104 to the input of the amplifier 116. In this configuration, the amplifier 114 is inactive and the amplifier 116 is active and operating to amplify a signal from the audio signal input 104 and supply the amplified signal to the speaker 112.

In the second instance, the control signal 124 may be used to activate the amplifier 114, the control input 125 may be used to inactivate the amplifier 116, and the control inputs 123 may be used to configure the switches 122a and 122b to decouple the audio signal input 104 from the input of the amplifier 116. In this configuration, the amplifier 116 is inactive and has no input to amplify while the amplifier 114 is active and operating to amplify the signal from the audio signal input 104 and supply the amplified signal to the speaker 112.

Where the amplifier 114 is a class D amplifier, its output switches between ground and $V_{DD}$ (a supply voltage) with a duty cycle that is determined by the signal from the audio signal input 104. In some class D amplifier circuits, a low-pass filter circuit operates on the output of the amplifier to filter out the amplifier switching frequency, leaving primarily an audio frequency amplified signal. In the amplifier circuit 102, a separate filter circuit is not used, and the output of the amplifier 114 is coupled directly to the speaker 112. The resistive and inductive loading properties of the speaker 112 operate to filter out the amplifier switching frequency.

Figure 2:
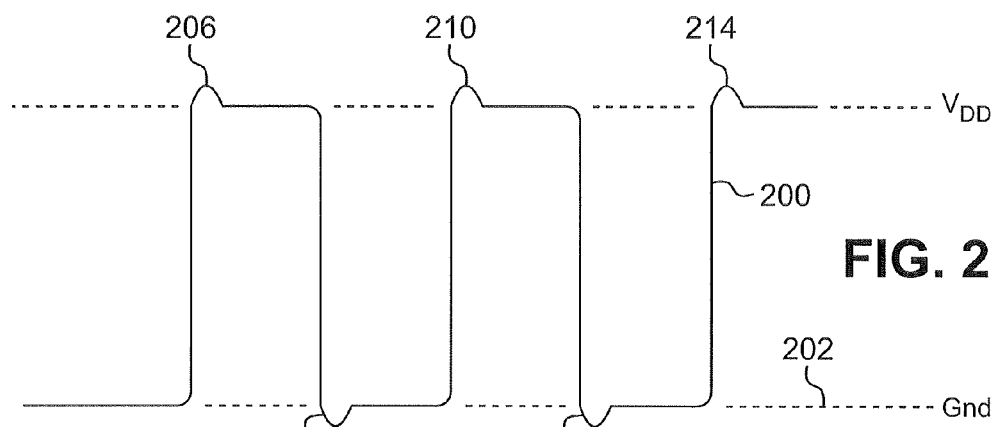
FIG. 2 illustrates an output waveform of a class D amplifier driving an inductive load.

FIG. 2 illustrates an output voltage waveform 200 of the amplifier 114 on the audio signal output 106, driving the speaker 112. As described above, the output of the amplifier 114 switches between ground 202 and $V_{DD}$ 204. Because of the rapid transition between ground 202 and $V_{DD}$ 204, inductive kick back from the speaker 112 may cause the voltage on the audio signal output 106 to rise above $V_{DD}$ 204 as shown at portions 206, 210 and 214 of the waveform 200. Similarly, inductive kick back from the speaker 112 may cause the voltage on the audio signal output 106 to fall below ground 202 as shown at portions 208 and 212 of the waveform 200.

Because the output of the amplifier 116 is coupled in parallel with the output of the amplifier 114 to the audio signal output 106, these voltages above $V_{DD}$ 204 and below ground 202 will also be present at the output of the amplifier 116. The feedback circuits 126a and 126b may conduct these voltages above VDD 204 and below ground 202 to the input of the amplifier 116 and to the switches 122a and 122b. Even though the switches 122a and 122b are configured to decouple the input of the amplifier 116 from the audio signal input 104 when the amplifier 114 is operating, voltages above $V_{DD}$ 204 and below ground 202 may be conducted through the switches 122a and 122b and the resistors 128a and 128b to the audio signal input 104.

Figure 3:
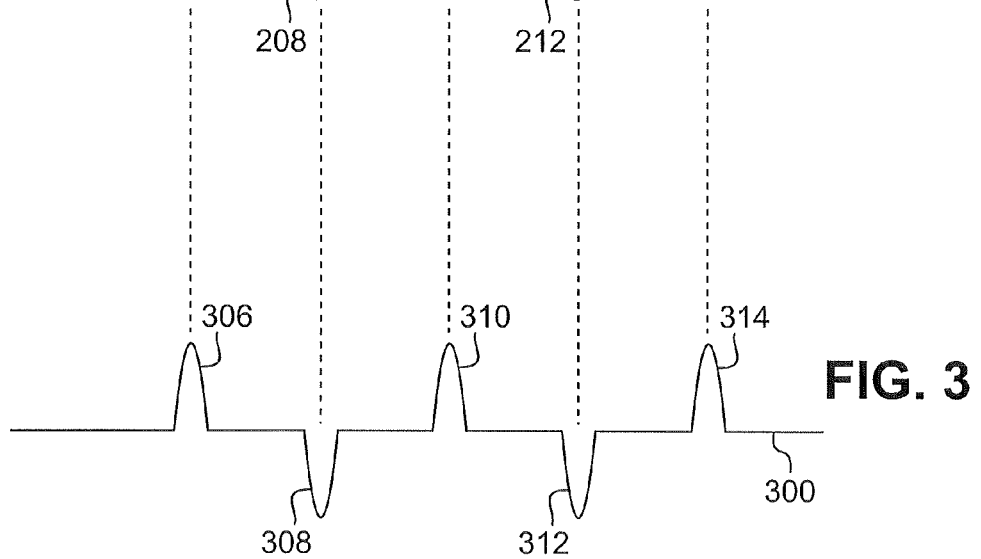
FIG. 3 illustrates glitches conducted to an input of the amplifier circuit of FIG. 1.

FIG. 3 illustrates a waveform 300 that may appear on one or both of the conductors 130 as a result of the conduction voltages above $V_{DD}$ 204 and below ground 202 through the switches 122a and 122b and the resistors 128a and 128b to the audio signal input 104. Voltage spikes (or 'glitches') may occur in portions 306, 308, 310, 312 and 314 of the waveform 300, corresponding to the portions 206, 208, 210, 212 and 214 of the waveform 200 where the voltage of the waveform 200 rises above $V_{DD}$ 204 or falls below ground 202. Because the conductors 130 couple the audio signal input 104 to the inputs of the amplifier 114, the amplifier 118 and the amplifier 120, each of those amplifiers will receive and amplify a signal that includes both the program signal at the audio signal input 104 and the noise signal of waveform 300. As such, the noise glitches of the waveform 300 will be reproduced in the amplified outputs of the amplifier 114, the amplifier 118 and the amplifier 120. This will cause undesirable noise at the outputs 106, 108 and 110.

Figure 4:
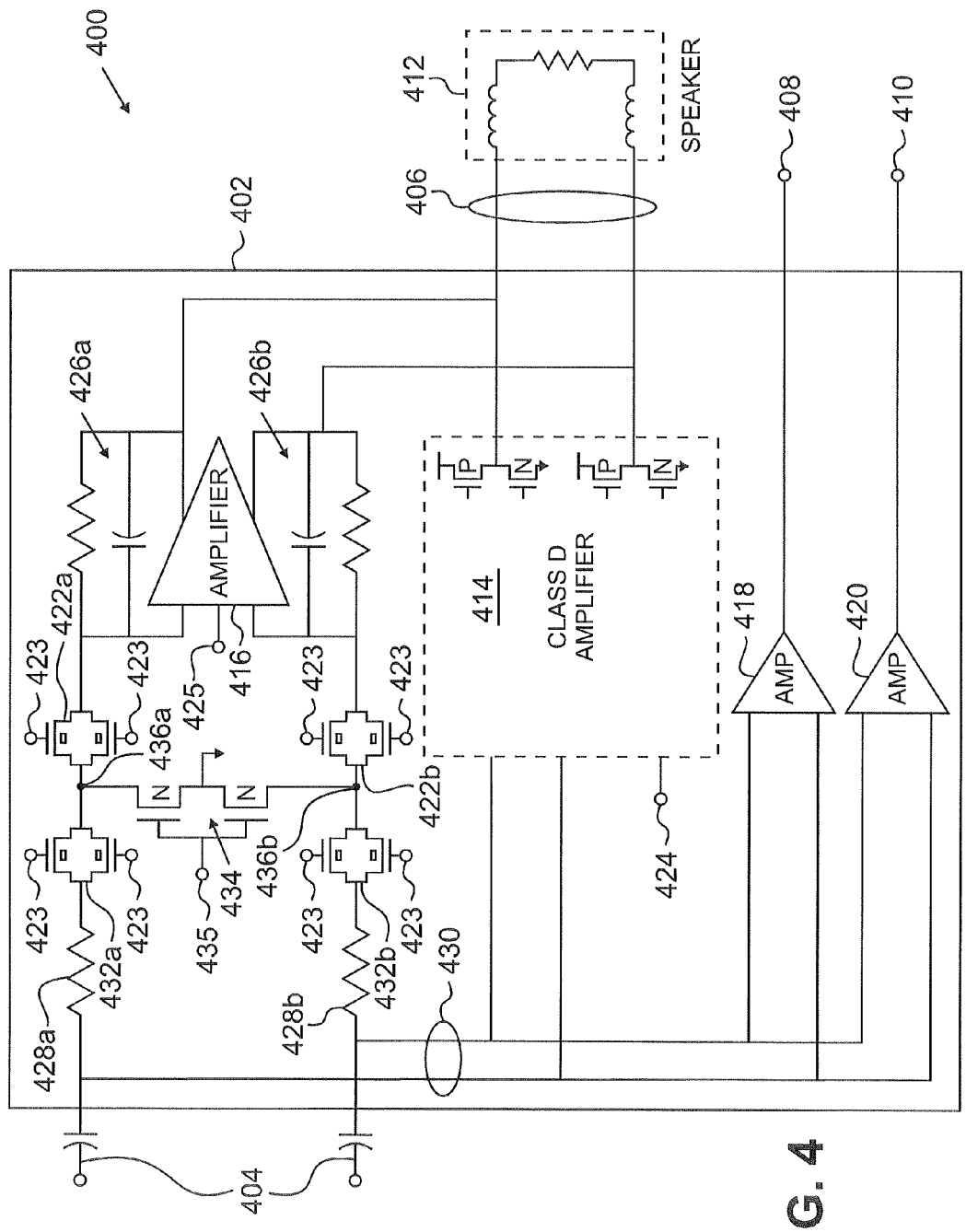
FIG. 4 illustrates a system that includes a speaker and an amplifier circuit in accordance with this disclosure.

FIG. 4 illustrates a system 400 that includes a speaker 412 and an amplifier circuit 402 in accordance with this disclosure. The amplifier circuit 402 includes an audio signal input 404 and an audio signal output 406, which is coupled to the speaker 412. The amplifier circuit 402 further includes an audio signal output 408 and an audio signal output 410.

The amplifier circuit 402 includes an amplifier 414, which may be a class D amplifier, and a second amplifier 416, which may be a class AB amplifier. The amplifier circuit 402 further includes amplifier 418 and amplifier 420. Conductors 430 couple the audio signal input 404 in parallel to the inputs of the amplifiers 414, 416, 418, and 420. The audio signal input 404 is a balanced input, although it will be understood that a single-ended audio signal input could also be used.

The amplifiers 414 and 416 provide balanced outputs and are coupled in parallel to the audio signal output 406 and, hence, to the speaker 412. Each of the amplifiers 418 and 420 provides a single-ended output, and the amplifiers 418 and 420 are respectively coupled to the audio signal output 408 and the audio signal output 410. It will be understood that any combination of balanced and single-ended audio signal outputs could be used.

Furthermore, while the outputs of the amplifiers 414 and 416 are shown coupled to each other within the amplifier circuit 402, it will be understood that the outputs of the amplifiers 414 and 416 could be coupled to each other externally to the amplifier circuit 402.

Feedback circuits 426a and 426b couple each side of the balanced audio signal output 406 to the balanced input of the amplifier 416. As shown in FIG. 4, the feedback circuits 426a and 426b are R-C circuits, however other feedback circuits could be used. A switch 422a couples one side of the balanced input of the amplifier 416 to a node 436a. Similarly, a switch 422b couples the other side of the balanced input of the amplifier 416 to a node 436b.

A switch 432a and a resistor 128a couple the node 436a to one side of the balanced audio signal input 104. Similarly, a switch 432b and a resistor 428b couple the node 436b to the other side of the balanced audio signal input 104. A switch 434 couples both nodes 436a and 436b to ground. In the amplifier circuit 403, the switch 434 is implemented using two n-channel devices coupled in series with their common node coupled to ground and their independent nodes coupled to nodes 436a and 436b, respectively. In the amplifier circuit 402, each of the switches 422a, 422b, 432a and 432b is implemented using back-to-back p-channel and n-channel devices, although other switches could be used. It will be understood that the control signal 423 may have an opposite polarity at the control terminal of a p-channel device than at the control terminal of an n-channel device.

As with the system 100, shown in FIG. 1, in some applications, the system 400 is used in a handheld device where a user, at certain times, holds the speaker 412 to her ear for use as an earpiece and, at other times, holds the speaker away from her ear, for hands-free or walkie-talkie operation. In the first instance, the amplifier 416 may be used to power the speaker 412, to reduce power consumption by the system 400 and noise. In the second instance, the amplifier 414 may be used to produce higher sound volumes from the speaker 412.

In the first instance, a control input 424 to the amplifier 414 may be used to inactivate the amplifier 414, a control input 425 may be used to activate the amplifier 416, and control inputs 423 may be used configure the switches 422a, 422b, 432a and 432b to couple the audio signal input 104 to the input of the amplifier 416. Additionally, a control input 435 may be used to uncouple the nodes 436a and 436b from ground. In this configuration, the amplifier 414 is inactive and the amplifier 416 is active and operating to amplify a signal from the audio signal input 404 and supply the amplified signal to the speaker 412.

In the second instance, the control signal 424 may be used to activate the amplifier 414, the control signal 425 may be used to inactivate the amplifier 416, and the control inputs 423 may be used to configure the switches 422a and 422b to decouple the input of the amplifier 416 from the nodes 436a and 436b. The control inputs 423 may further be used to configure the switches 432a and 432b to decouple the audio signal input 404 from the nodes 436a and 436b. Additionally, the control input 435 may be used to couple the nodes 436a and 436b to ground. In this configuration, the amplifier 416 is inactive and has no input to amplify, while the amplifier 414 is active and operating to amplify the signal from the audio signal input 404 and supply the amplified signal to the speaker 412.

As described for the amplifier circuit 102 shown in FIG. 1, voltages above $V_{DD}$ and below ground at the audio signal output 406 may be conducted by the feedback circuits 426a and 426b to the input of the amplifier 416 and through the switches 422a and 422b. However, in the amplifier circuit 402 such voltages are further isolated from the audio signal input 404 by the switches 432a and 432b, as well as being conducted to ground by the switch 434. In this way, the noise glitches of the waveform 300 are greatly reduced or eliminated and, therefore, are greatly reduced or eliminated in the amplified outputs of the amplifier 414, the amplifier 418 and the amplifier 420.

Although FIG. 4 illustrates one example of a system 400 that includes a speaker 412 and an amplifier circuit 402, various changes may be made to FIG. 4. For example, the system 400 could include any suitable number of amplifiers, such as only two amplifiers. Also, the system 400 could use any suitable type(s) of amplifiers.

Figure 5:
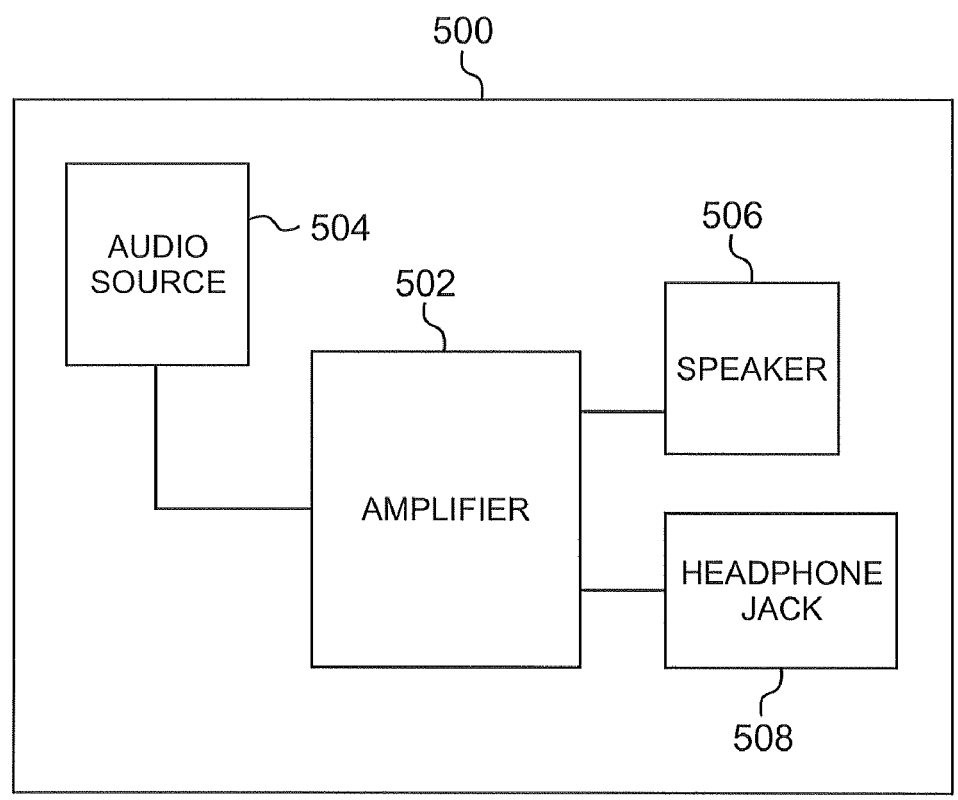
FIG. 5 illustrates an audio device employing an amplifier circuit in accordance with this disclosure.

FIG. 5 illustrates an audio device 500 employing an amplifier circuit 502 in accordance with this disclosure. The audio device 500 may be a wireline telephone or may be a cellphone, personal digital assistant, or other wireless communication device. The audio device may also be a portable music or gaming system.

The audio device 500 includes an audio source 504, which may be recorded audio or audio decoded from a wireless or wireline communication system. An audio output of the audio source 504 is coupled to an audio signal input of the amplifier circuit 502. A first audio signal output of the amplifier circuit 502 is coupled to a speaker 506. A second audio signal output of the amplifier circuit 502 is coupled to a headphone jack 508. In this example, the amplifier circuit 502 could represent the amplifier circuit 402 of FIG. 4, which uses different amplifiers to provide different levels of amplification for signals sent to the speaker 506 and the headphone jack 508.

Although FIG. 5 illustrates one example of an audio device 500 employing an amplifier circuit 502, various changes may be made to FIG. 5. For example, amplified signals could be provided to any other suitable destination(s).

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
    first and second amplifiers, each having an input coupled to an audio signal input and an output coupled to an audio signal output, the second amplifier also having a feedback path from its output to its input;
    a first switch coupled to the audio signal input, the input to the first amplifier, and a first node, where the first switch is operable to selectively couple and uncouple the audio signal input and the input to the first amplifier to and from the first node;
    a second switch coupled to the input to the second amplifier and to the first node, where the second switch is operable to selectively couple and uncouple the input to the second amplifier to and from the first node; and
    a third switch coupled to the first node and to ground, where the third switch is operable to selectively couple and uncouple the first node to and from ground.

2. The apparatus of claim 1, wherein the audio signal input and the inputs to the first and the second amplifiers are balanced inputs, each balanced input having a first side and a second side, the first sides of the audio signal input and the input to the first amplifier coupled to the first switch, the first side of the input to the second amplifier coupled to the second switch, the apparatus further comprising:
    a fourth switch coupled to the second side of the audio signal input, the second side of the input to the first amplifier, and a second node, where the fourth switch is operable to selectively couple and uncouple the second side of the audio signal input and the second side of the input to the first amplifier to and from the second node; and
    a fifth switch coupled to the second side of the input to the second amplifier and to the second node, where the fifth switch is operable to selectively couple and uncouple the second side of the input to the second amplifier to and from the second node; and
    wherein the third switch is further coupled to the second node and is further operable to selectively couple and uncouple the second node to and from ground.

3. The apparatus of claim 2, wherein the third switch is a series pair of N-channel devices having their common node coupled to ground.

4. The apparatus of claim 3, wherein at least one of the first, second, fourth and fifth switches is a back-to-back P-channel/N-channel pair.

5. The apparatus of claim 2, wherein:
    the audio signal output is a balanced output having a first side and a second side;
    the feedback path of the second amplifier has a first side and a second side;
    the first side of the feedback path couples the first side of the audio signal output to the first side of the input to the second amplifier; and
    the second side of the feedback path couples the second side of the audio signal output to the second side of the input to the second amplifier.

6. The apparatus of claim 1, wherein:
    in a first configuration:
        the first amplifier is inactive;
        the second amplifier is active;
        the first switch is configured to couple the first node to the audio signal input and to the input to the first amplifier;
        the second switch is configured to couple the first node and the input to the second amplifier; and
        the third switch is configured to uncouple the first node from ground, and
    in a second configuration:
        the first amplifier is active;
        the second amplifier is inactive;
        the first switch is configured to uncouple the first node from the audio signal input and from the input to the first amplifier;

the second switch is configured to uncouple the first node from the input to the second amplifier; and
the third switch is configured to couple the first node to ground.

7. The apparatus of claim 1, wherein the first amplifier is a class D amplifier.

8. The apparatus of claim 1, wherein the second amplifier is a class AB amplifier.

9. A system comprising:
an audio source;
a speaker; and
an amplifier circuit comprising:
   first and second amplifiers, each having an input coupled to the audio source and an output coupled to the speaker, the second amplifier also having a feedback path from its output to its input;
   a first switch coupled to the audio source, the input to the first amplifier, and a first node, where the first switch is operable to selectively couple and uncouple the audio source and the input to the first amplifier to and from the first node;
   a second switch coupled to the input to the second amplifier and to the first node, where the second switch is operable to selectively couple and uncouple the input to the second amplifier to and from the first node; and
   a third switch coupled to the first node and to ground, where the third switch is operable to selectively couple and uncouple the first node to and from ground.

10. The system of claim 9, wherein the audio source and the inputs to the first and the second amplifiers comprise balanced inputs, each balanced input having a first side and a second side, the first sides of the audio source and the input to the first amplifier coupled to the first switch, the first side of the input to the second amplifier coupled to the second switch, the apparatus further comprising:
   a fourth switch coupled to the second side of the audio source, the second side of the input to the first amplifier, and a second node, where the fourth switch is operable to selectively couple and uncouple the second side of the audio source and the second side of the input to the first amplifier to and from the second node; and
   a fifth switch coupled to the second side of the input to the second amplifier and to the second node, where the fifth switch is operable to selectively couple and uncouple the second side of the input to the second amplifier to and from the second node;
   wherein the third switch is further coupled to the second node and is further operable to selectively couple and uncouple the second node to ground.

11. The system of claim 10, wherein:
the third switch is a series pair of N-channel devices having their common node coupled to ground; and
at least one of the first, second, fourth and fifth switches is a back-to-back P-channel/N-channel pair.

12. The system of claim 10, wherein the speaker comprises a balanced output having a first side and a second side, and the feedback path of the second amplifier has a first side and a second side, where the first side of the feedback path couples the first side of the speaker to the first side of the input to the second amplifier, and the second side of the feedback path couples the second side of the speaker to the second side of the input to the second amplifier.

13. The system of claim 9, wherein:
in a first configuration,
   the first amplifier is inactive,
   the second amplifier is active,
   the first switch is configured to couple the first node to the audio source and to the input to the first amplifier,
   the second switch is configured to couple the first node to the input to the second amplifier, and
   the third switch is configured to uncouple the first node from ground, and
in a second configuration,
   the first amplifier is active,
   the second amplifier is inactive,
   the first switch is configured to uncouple the first node from the audio source and from the input to the first amplifier,
   the second switch is configured to uncouple the first node from the input to the second amplifier, and
   the third switch is configured to couple the first node to ground.

14. The system of claim 9, wherein the first amplifier is a class D amplifier.

15. A method comprising, in a first mode of operation:
amplifying a signal from an audio signal input using a first amplifier and supplying the amplified signal to an audio signal output;
uncoupling a first node from the audio signal input and from the input to the first amplifier;
uncoupling the first node from an input to a second amplifier, where the second amplifier has a feedback path from an output to the input to the second amplifier, and where the output of the second amplifier is coupled to the output of the first amplifier and to the audio signal output; and
coupling the first node to ground.

16. The method of claim 15, where:
the audio signal input and the input to the second amplifier are balanced inputs, each balanced input having a first side and a second side;
uncoupling the first node from the audio signal input comprises uncoupling the first node from the first side of the audio signal input;
uncoupling the first node from the input to the second amplifier comprises uncoupling the first node from the first side of the input to the second amplifier; and
the method further comprises, in the first mode of operation, uncoupling a second node from the second side of the audio signal input, uncoupling the second node from the second side of the input to the second amplifier, and coupling the second node to ground.

17. The method of claim 16, where the first node and the second node are coupled to ground using a series pair of N-channel devices having their common node coupled to ground.

18. The method of claim 17, where at least one of the steps of uncoupling is performed using a back-to-back P-channel/N-channel pair.

19. The method of claim 15, further comprising, in a second mode of operation:
inactivating the first amplifier;
coupling the first node to the audio signal input;
coupling the first node to the input to the second amplifier;
uncoupling the first node from ground; and
amplifying the signal from the audio signal input using the second amplifier and supplying the amplified signal to the audio signal output.

20. The method of claim 15, where amplifying the signal with the first amplifier comprises amplifying the signal with a class D amplifier.

* * * * *